(12) United States Patent
Matsubara et al.

(10) Patent No.: US 11,274,217 B2
(45) Date of Patent: Mar. 15, 2022

(54) COATING LIQUID AND METHOD FOR MANUFACTURING THERMOELECTRIC MEMBER

(71) Applicant: KABUSHIKI KAISHA TOYOTA CHUO KENKYUSHO, Nagakute (JP)

(72) Inventors: Masato Matsubara, Nagakute (JP); Yumi Saiki, Nagakute (JP); Ryoji Asahi, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 16/959,686

(22) PCT Filed: Feb. 19, 2019

(86) PCT No.: PCT/JP2019/005968
§ 371 (c)(1),
(2) Date: Jul. 2, 2020

(87) PCT Pub. No.: WO2019/176463
PCT Pub. Date: Sep. 19, 2019

(65) Prior Publication Data
US 2021/0079234 A1 Mar. 18, 2021

(30) Foreign Application Priority Data
Mar. 12, 2018 (JP) .............................. JP2018-043780

(51) Int. Cl.
*C09D 7/48* (2018.01)
*C09D 1/00* (2006.01)
(Continued)

(52) U.S. Cl.
CPC ................. *C09D 7/48* (2018.01); *C09D 1/00* (2013.01); *H01L 35/02* (2013.01); *H01L 35/16* (2013.01); *H01L 35/34* (2013.01)

(58) Field of Classification Search
CPC .. C09D 7/48; C09D 1/00; H01L 35/02; H01L 35/16; H01L 35/34
See application file for complete search history.

(56) References Cited

U.S. PATENT DOCUMENTS 7,461,512 B2 12/2008 Sakamoto et al.
2002/0176815 A1 11/2002 Fleurial et al.
(Continued)

FOREIGN PATENT DOCUMENTS

CN 103531704 A 1/2014
JP S49-019690 B1 5/1974
(Continued)

OTHER PUBLICATIONS

Komatsu. "KELK to Launch Sales of the World's Highest Efficiency . . . " <https://www.kelk.co.jp/english/news/090128.html>. Saved on Jun. 2, 2020.
(Continued)

*Primary Examiner* — Jayne L Mershon
(74) *Attorney, Agent, or Firm* — Oliff PLC

(57) ABSTRACT

A coating liquid includes aluminum phosphate, a nonionic surfactant, and water and/or water-soluble solvent that dissolves or disperses the aluminum phosphate and the nonionic surfactant. An amount of the nonionic surfactant is preferably 1 vol % or more and 10 vol % or less. The nonionic surfactant is preferably at least one selected from the group consisting of ester, ether, alkylglycoside, octylphenol ethoxylate, pyrrolidone, and polyhydric alcohol. Applying such a coating liquid to a surface of a thermoelectric member, and drying and firing the coating liquid enables formation of a dense antioxidant film containing aluminum phosphate on the surface of the thermoelectric member.

8 Claims, 1 Drawing Sheet

(51) Int. Cl.
  *H01L 35/34* (2006.01)
  *H01L 35/16* (2006.01)
  *H01L 35/02* (2006.01)

(56) References Cited

U.S. PATENT DOCUMENTS

| | | | |
|---|---|---|---|
| 2005/0106384 A1 | 5/2005 | Sambasivan et al. | |
| 2005/0271916 A1 | 12/2005 | Yang et al. | |
| 2015/0107641 A1* | 4/2015 | Sawa | H01L 35/34 136/239 |

FOREIGN PATENT DOCUMENTS

| | | | |
|---|---|---|---|
| JP | S53-018636 A | 2/1978 | |
| JP | S55-008494 A | 1/1980 | |
| JP | H3-138377 A | 6/1991 | |
| JP | H10-158852 A | 6/1998 | |
| JP | 2002-317276 A | 10/2002 | |
| JP | 2004-228293 A | 8/2004 | |
| JP | 2005-535554 A | 11/2005 | |
| JP | 2007-258571 A | 10/2007 | |
| JP | 2012-156227 A | 8/2012 | |
| JP | 2013-500608 A | 1/2013 | |
| JP | 2015-018853 A | 1/2015 | |
| JP | 2015-050272 A | 3/2015 | |
| JP | 2016-524438 A | 8/2016 | |
| JP | 2017-031325 A | 2/2017 | |
| JP | 2017031325 | * | 2/2017 |
| WO | 2009/093455 A1 | 7/2009 | |
| WO | 2014/010588 A1 | 1/2014 | |
| WO | 2016/042051 A1 | 3/2016 | |

OTHER PUBLICATIONS

May 21, 2019 Written Opinion of Searching Authority issued in International Patent Application No. PCT/JP2019/005968.
May 21, 2019 Search Report issued in International Patent Application No. PCT/JP2019/005968.
Brostow, Witold et al. "Bismuth Telluride-Based Thermoelectric Materials: Coatings as Protection Against Thermal Cycling Effects". J. Mater. Res., vol. 27, No. 22., pp. 2930-2936. 2012.
Hongliang Dong et al., "Fabrication and Thermal Aging Behavior of Skutterudites With Silica-Based Composite Protective Coatings", Journal of Alloys and Compound, vol. 527, (2012), pp. 247-251.
Degang Zhao et al., "Protective Properties Of YSZ/Ti Film Deposited on CoSb3 Thermoelectric Material", Corrosion Science, vol. 98, (2015), pp. 163-169.
Jan. 7, 2020 Office Action issued in Japanese Patent Application No. 2017-120361.
Mar. 20, 2020 U.S. Office Action issued U.S. Appl. No. 15/713,000.
Jun. 25, 2020 Office Action Issued in U.S. Appl. No. 15/713,000.
U.S. Appl. No. 15/713,000, filed Sep. 22, 2017 in the name of Saiki et al.
Oct. 7, 2020 U.S. Office Action issued U.S. Appl. No. 15/713,000.
Aug. 18, 2020 Office Action issued in Japanese Patent Application No. 2018-043780.
Aug. 4, 2020 Office Action issued in Japanese Patent Application No. 2017-120361.
Sep. 15, 2020 International Preliminary Report on Patentability issued in International Patent Application No. PCT/JP2019/005968.
Mar. 30, 2021 Office Action issued in Japanese Patent Application No. 2017-120361.
May 27, 2021 Office Action Issued in U.S. Appl. No. 15/713,000.
Dec. 2, 2021 Office Action Issued U.S. Appl. No. 15/713,000.

* cited by examiner

| CONCENTRATION | ALIMINUM PHOSPHATE ONLY — | ALUMINUMU PHOSPHATE WITH TRITON X | | |
|---|---|---|---|---|
| | | 1% | 5% | 10% |
| N-TYPE | | | | |
| EVALUATION | ○ | ○ | ○ | ○ |
| P-TYPE-1 | | | | |
| EVALUATION | ○ | × | ○ | ○ |
| P-TYPE-2 | | | | |
| EVALUATION | × | △ | × | ○ |

COATING LIQUID AND METHOD FOR MANUFACTURING THERMOELECTRIC MEMBER

FIELD OF THE INVENTION

The present invention relates to a coating liquid and a method for manufacturing a thermoelectric member. More specifically, the present invention relates to a coating liquid that enables formation of a film (antioxidant film) on a surface of a base material to prevent volatilization and/or oxidation of elements included in the base material and relates to a method for manufacturing a thermoelectric member using the coating liquid.

BACKGROUND OF THE INVENTION

In order to solve environmental and energy problems, technology of reusing exhaust heat remains to be established. To solve this problem, thermoelectric power generation technology for converting waste heat into electric energy has been studied. The power generation efficiency in this technology depends on the dimensionless FIGURE of merit ZT of a thermoelectric material and an exhaust heat temperature. The higher the both values, the higher the power generation efficiency.

Bismuth-telluride-based thermoelectric materials have been studied for a long time and are commercially available as power generation modules (Non-Patent Literature 1). However, the regular operating temperature of bismuth-telluride-based thermoelectric materials is 250° C. or lower. In order to enhance power generation efficiency and to utilize a wider range of heat sources, the operating temperature is to be raised.

On the other hand, using thermoelectric materials at high temperatures may deteriorate performances of the materials due to oxidation. As one countermeasure, there is proposed a method for applying an aerosol coating to a surface of a cobalt-antimonide-based thermoelectric material used in a medium temperature range.

For example, Non-Patent Literature 2 discloses a method involving:
(a) preparing a hybrid silica sol from a commercially available silica sol and methyltriethoxysilane (MTES);
(b) preparing a coating slurry containing the hybrid silica sol, a glass frit (containing SnO and $P_2O_5$ as main chemical components and a small amount of ZnO and $SiO_2$) or alumina particles, and a solvent;
(c) applying the coating slurry to a surface of a skutterudite-based thermoelectric material ($CeFe_3CoSb_{12}$ or $Yb_{0.3}Co_4Sb_{12}$) by the slurry blade method; and
(d) solidifying the slurry in vacuum at 373 K for 10 hours to form a silica-based composite coating on the surface of the thermoelectric material.

This document describes the following points:
(a) the glass frit-hybrid silica coating system enables a thick coating layer without cracks or peeling;
(b) when the skutterudite-based thermoelectric material with the composite coating is heat-treated at 873K for 2 hours in vacuum, Sb does not diffuse into the coating layer, but a large amount of Sn diffuses from the coating layer into the thermoelectric material; and
(c) a small amount of Co—P is generated at an interface between the composite coating and the thermoelectric material.

Furthermore, in regard to bismuth-telluride-based thermoelectric materials, for example, the improvement of thermal durability by a polymer film has been studied (Non-Patent Literature 3). Still further, a method for casing a module itself has been proposed (Patent Literature 1).

As described in Non-Patent Literature 2, when a surface of $CoSb_3$ is coated with a composite film including glass frit-hybrid silica, it is possible to prevent volatilization of Sb to some extent. However, such a composite film is not uniform and not dense. Accordingly, a thickness of several hundreds of microns is required to obtain resistance of Sb volatility. In addition, heat treatment causes Sn or P to react with thermoelectric materials or to diffuse into thermoelectric materials. Therefore, there are problems in process reproducibility and in long-term stability.

Furthermore, a method for protecting a material with a casing is expensive. Still further, when a polymer film is formed on a bismuth-telluride-based thermoelectric material, the heat-resistant temperature is 250° C. or lower, and thermoelectric properties significantly deteriorate at high temperatures.

Moreover, when a surface of a material is protected with a coating liquid, the coating liquid may be repelled from the surface of the material, which makes it difficult to form a dense film on the surface of the material. However, in the related art, there is no example of a coating liquid that enables formation of a dense antioxidant film regardless of the state of a material surface.

CITATION LIST

Patent Literature

Patent Literature 1: JP 2012-156227A

Non-Patent Literature

Non-Patent Literature 1: Website of KELK Ltd. (http://www.kelk.co.jp/news/090128.html)
Non-Patent Literature 2: Journal of alloys and compounds, 527, 247(2012)
Non-Patent Literature 3: Journal of materials research, vol. 27, pp. 2930-2936

SUMMARY OF THE INVENTION

An object of the present invention is to provide a coating liquid that enables formation of a film (antioxidant film) on a surface of a base material to prevent volatilization and/or oxidation of elements included in the base material.

Another object of the present invention is to provide a coating liquid that enables formation of a dense antioxidant film regardless of surface conditions of the base material.

Furthermore, another object of the present invention is to provide a method for manufacturing a thermoelectric member that includes such a dense antioxidant film.

In order to solve the above problems, a coating liquid according to the present invention includes:
aluminum phosphate;
a nonionic surfactant; and
water and/or water-soluble solvent that dissolves or disperses the aluminum phosphate and the nonionic surfactant.

A method for manufacturing a thermoelectric member according to the present invention includes:
applying the coating liquid according to the present invention to a surface of a thermoelectric member to form a coating film;

drying the coating film to obtain a precursor film; and firing the thermoelectric member provided with the precursor film.

A coating liquid containing aluminum phosphate can be applied not only to thermoelectric materials but also to any material in which volatilization or oxidation of constituent elements poses a problem. However, when such a coating liquid is applied to a surface of a certain kind of material, the coating liquid may be repelled from the surface of the material, causing a possibility that a dense antioxidant film cannot be formed.

In contrast, when a proper amount of nonionic surfactant is added to the coating liquid, it is possible to form a dense antioxidant film regardless of the type of material. It is considered that, when a coating liquid is applied to a material having a hydrophobic surface, the addition of a nonionic surfactant to the coating liquid improves the wettability of the coating liquid on the material surface.

BRIEF DESCRIPTION OF THE DRAWINGS

FIG. 1 is cross-sectional photographs of N-type bismuth telluride and P-type bismuth telluride after durability test (held at 380° C. in the air for 24 hours) in which various types of coating liquids with different amounts of nonionic surfactants are used to form an antioxidant film.

DETAILED DESCRIPTION OF PREFERRED EMBODIMENTS

Hereinafter, an embodiment of the present invention will be described in detail.

[1. Coating Liquid]

The coating liquid according to the present invention includes:

aluminum phosphate;

a nonionic surfactant; and water and/or water-soluble solvent that dissolves or disperses the aluminum phosphate and the nonionic surfactant.

[1.1. Aluminum Phosphate]

The aluminum phosphate ($AlPO_4$) is dissolved or dispersed in the coating liquid. When the coating liquid having the aluminum phosphate partially or thoroughly dissolved is applied to a surface of a base material and heat-treated at a relatively low temperature, a film containing the aluminum phosphate as a main component is formed on the surface of the base material. In this case, it is often the case that the film is in an amorphous state (a state in which aluminum phosphate units form a glass-like network).

The particle size of aluminum phosphate contained in the coating liquid is not particularly limited. In general, the smaller the particle size of aluminum phosphate, the better it is to form a thin and uniform film. Specifically, the average particle size of aluminum phosphate is preferably 100 nm or less.

[1.2. Nonionic Surfactant]

The nonionic surfactant is added to improve wettability of the coating liquid on the surface of the base material. A molecule of the nonionic surfactant has a hydrophilic portion and a hydrophobic portion. Accordingly, the addition of the nonionic surfactant to the coating liquid makes the coating liquid less likely to be repelled even from a base material having a highly hydrophobic surface. Furthermore, the nonionic surfactant does not change the pH of the coating liquid. Accordingly, the addition of the nonionic surfactant to the coating liquid does not cause unintentional precipitations in the coating liquid.

Examples of such a nonionic surfactant include esters, ethers, alkylglycosides, octylphenol ethoxylates, 1-methyl-2-pyrrolidone ($C_4H_7NO$), and polyhydric alcohols. The coating liquid may contain any one or two or more of these nonionic surfactants.

Examples of the esters include glycerin fatty acid esters (such as glycerin stearic acid ester and glycerin lauric acid ester), sorbitan fatty acid esters (such as sorbitan lauric acid ester, sorbitan palmitic acid ester, sorbitan stearic acid ester, and sorbitan oleic acid ester), and sucrose fatty acid esters (such as sucrose lauric acid ester, sucrose stearic acid ester, sucrose palmitic acid ester, and sucrose oleic acid ester).

Examples of the ethers include polyoxyethylene octyl ether, triethylene glycol monobutyl ether, polyoxyethylene methyl phenyl ether, polyoxyethylene ethyl phenyl ether, polyoxyethylene methyl ether, polyoxyethylene ethyl ether, and polyoxyethylene polyoxypropylene glycol.

Examples of the alkylglycosides include n-octyl-β-D-glucoside, n-octyl-β-D-maltoside, n-decyl-β-D-glucoside, n-decyl-β-D-maltoside, n-dodecyl-β-D-glucoside, n-heptyl-β-D-thioglucoside, n-octyl-β-D-thioglucoside, and n-nonyl-β-D-thiomaltoside.

Examples of the octylphenol ethoxylates include Triton X-100, Triton X-114, Nonidet P-40, and Igepal CA-630.

Examples of the polyhydric alcohols include ethylene glycol, glycerin, mannitol, and sorbitol.

[1.3. Solvent]

The coating liquid contains water and/or a water-soluble solvent as a solvent for dissolving or dispersing the aluminum phosphate and the nonionic surfactant. Examples of the water-soluble solvent include ethanol, methanol, propanol, butanol, tetrahydrofuran, acetone, acetonitrile, dimethylformamide, and pyridine.

In the present invention, the solvent contained in the coating liquid is not particularly limited. An optimum solvent can be employed according to the intended purpose. Typically, a mixed solvent of water and ethanol is used from a viewpoint of cost and handleability.

[1.4. Other Components]

The coating liquid may contain other components as long as a uniform film can be formed on a surface of a base material.

For example, the coating liquid may contain a small amount of $Al(OH)_3$. It is considered that $Al(OH)_3$ is produced by the decomposition of part of aluminum phosphate. $Al(OH)_3$ in the coating liquid may have a concentration of about 2 to 4 wt %.

In addition, the coating liquid, may further contain (a) an additive to form a thick film (for example, SiC powder and $SiO_2$ powder), and (b) nitric acid to adjust the pH and to make the aluminum phosphate soluble.

[1.5. Composition of Coating Liquid]

[1.5.1. Amount of Aluminum Phosphate]

When an amount of the aluminum phosphate contained in the coating liquid is too small, it is difficult for the coating liquid to form a dense film by one-time coating. Accordingly, the amount of the aluminum phosphate contained in the coating liquid is preferably 20 wt % or more. The amount of the aluminum phosphate is more preferably 30 wt % or more.

On the other hand, when the amount of the aluminum phosphate is excessive, the coating liquid excessively increases in viscosity, which makes it difficult to form a uniform film. Accordingly, the amount of the aluminum phosphate contained in the coating liquid is preferably 60 wt % or less. The amount of the aluminum phosphate is more preferably 40 wt % or less.

[1.5.2. Amount of Nonionic Surfactant]

In a case where a base material has a hydrophobic surface, the larger the amount of the nonionic surfactant, the easier the coating liquid is to wet the surface of the base material. To obtain such effects, the amount of the nonionic surfactant is preferably 1 vol % or more. The amount of the nonionic surfactant is more preferably 5 vol % or more, and still more preferably 7.5 vol % or more.

On the other hand, adding an extra nonionic surfactant makes no difference in effect and no practical benefit. Accordingly, the amount of the nonionic surfactant is 10 vol % or less.

[1.6. Use]

The coating liquid according to the present invention can be applied to any base material in which volatilization or oxidation of constituent elements poses a problem. In particular, intermetallic compound-based thermoelectric materials often contain easily volatilized elements and/or easily oxidized elements and are used in an intermediate to high temperature range. Accordingly, when the coating liquid according to the present invention is employed for surface coating of a thermoelectric material, it is possible to prevent deterioration of thermoelectric properties due to volatilization or oxidation of constituent elements.

Herein, the "easily volatilized elements" represent elements whose equilibrium temperatures at a vapor pressure of 10 Pa are 700° C. or lower (for example, Li, Na, Ca, Mg, P, S, K, Zn, Se, Sr, Cd, Sb, Te, Eu, and Yb).

The "easily oxidized elements" represent elements whose standard redox potentials ($E_0$) of metals are −1 V or less (for example, Li, K, Ba, Sr, Ca, Na, Mg, Al, Ti, Zr, Hf, and Mn).

Example of the easily volatilized elements or the easily oxidized elements include Sb, Mg, Ti, Hf, Zr, Li, Na, Ca, P, S, K, Zn, Se, Sr, Cd, Te, Eu, Yb, Ba, Al, and Mn. The thermoelectric material may contain any one of these elements, or may contain two or more kinds.

Specific examples of the intermetallic compound-based thermoelectric materials include (a) R(Fe, Co)Sb$_{12}$-based thermoelectric materials (R=at least one element selected from the group consisting of La, Ba, Yb, Ca, In, Al, Ga, Ti, Zr, and Hf), (b) half-Heusler materials: ANiSn, ACoSb=Ti, Zr, Hf), (c) chalcogenide compounds: ZnSb, Bi$_2$(Sb, Te)$_3$, PbTe, La$_3$Te$_4$, PbSe, Sb$_2$Se$_3$, Bi$_2$Se$_3$, Ag$_2$Te, Yb$_{14}$MnSb$_{11}$, (Ge Te)$_{1-x}$(AgSbTe$_2$)$_x$, Cu—Sb—Se, Cu—Sb—S, Cu—Sn—S, Cu$_{2-x}$Se, Cu$_{2-x}$S, Cu$_{2-x}$Te, (d) silicides: Mg$_2$(Si, Sn), and (e) clathrates: Ba$_8$Ga$_{16}$Ge$_{30}$, Sr$_8$Ga$_{16}$Ge$_{30}$.

When a coating liquid with no nonionic surfactant is applied to a surface of N-type bismuth telluride among these examples, the coating liquid is not repelled from the surface, and a uniform film can be formed. A possible reason is that N-type bismuth telluride has a hydrophilic surface.

On the other hand, when a coating liquid with no nonionic surfactant is applied to a surface of P-type bismuth telluride, the coating liquid is repelled from the surface, and a uniform film cannot be formed. A possible reason is that P-type bismuth telluride has a hydrophobic surface.

In contrast, when the coating liquid according to the present invention is applied to P-type bismuth telluride, a uniform film can be famed. A possible reason is that the addition of a nonionic surfactant to the coating liquid improves the wettability of the coating liquid with respect to the hydrophobic surface.

[2. Method for Manufacturing Thermoelectric Member]

A method for manufacturing a thermoelectric member according to the present invention includes:

applying the coating liquid according to the present invention to a surface of a thermoelectric member to form a coating film;

drying the coating film to obtain a precursor film; and firing the thermoelectric member provided with the precursor film.

[2.1. Applying Step]

First, the coating liquid according to the present invention is applied to the surface of the thermoelectric member to form a coating film (applying step).

The thermoelectric member is not particularly limited in shape and material. The optimum shape and material can be selected according to the intended use. As described above, the material of the thermoelectric member is preferably P-type bismuth telluride.

A method for applying the coating liquid is not particularly limited. Examples of the coating method include spray atomizing and dipping. Furthermore, coating may be performed once or several times. Still further, applying/drying/firing may be performed once or repeated several times.

[2.2. Drying Step]

Next, the coating film is dried to obtain a precursor film (drying step). Conditions of the drying are not particularly limited as long as the drying enables volatilization of a solvent and formation of a uniform precursor film. Typically, the drying is performed at a temperature of 100° C. or lower.

[2.3. Firing Step]

Next, the thermoelectric member provided with the precursor film is fired (firing step). Accordingly, a dense antioxidant film can be formed on the surface of the base material.

The firing is performed to densify the precursor film. Generally, when the firing temperature is too low and/or the firing time is too short, it is difficult to form a dense film. On the other hand, when the firing temperature is too high and/or the firing time is too long, not only there is no practical benefit, but also a reaction between the film and the thermoelectric material may be caused.

Optimum conditions of the firing depend on the composition of the thermoelectric material, but the firing temperature is preferably 300° C. or higher. The firing time is preferably 30 minutes to 12 hours, and more preferably 30 minutes to 1 hour. An atmosphere during the firing is not particularly limited. Typically, the firing is performed in the air.

[2.4. Where to Form Film]

The film may be coated on the entire surface of the thermoelectric member or may be coated on a part thereof. The thermoelectric material is typically shaped into a rod. One end of the rod is heated to a high temperature, and the other end of the rod is kept at a low temperature. Accordingly, it is sufficient that at least a region where vaporization or oxidation of constituent elements poses a problem is coated with a film.

Specifically, the film is preferably coated on at least a region of the surface of the thermoelectric member where the temperature becomes 500° C. or higher in use.

[2.5. Thickness of Film]

The film is not particularly limited in thickness. The optimum thickness can be selected according to the intended purpose. Generally, when the film is too thin, the effect of preventing the volatilization and oxidation of the constituent elements becomes insufficient. Accordingly, the thickness of the film is preferably 0.7 μm or more.

On the other hand, when the film is too thick, not only the effect of preventing volatilization and oxidation is saturated, but also pinholes and cracks may be generated in the film. Accordingly, the thickness of the film is preferably 2.0 μm or less. The thickness of the film is more preferably less than 1.5 μm.

[3. Thermoelectric Element and Manufacturing Method Thereof]

Generally, a thermoelectric element has a structure in which a columnar p-type thermoelectric member (leg) and a columnar n-type thermoelectric member (leg) are arranged in parallel and one end of both is joined by an electrode (n-type structure). Furthermore, a thermoelectric element may have a structure in which such n-type structures are arranged on the xy plane and connected in series or a structure in which such n-type structures are arranged on the xy plane and stacked in the z-axis direction (cascade structure).

In the present invention, the thermoelectric element is not particularly limited in structure. In other words, the coating liquid according to the present invention can be applied to thermoelectric elements having any structure.

When a film is formed on a surface of a thermoelectric element using the coating liquid according to the present invention, the thermoelectric member and an electrode may be joined before forming the film or after forming the film. However, when the film is foiled before joining the thermoelectric member and the electrode, there is a possibility that the film near the interface comes off. Therefore, it is preferable to form the film after joining the thermoelectric member and the electrode.

[4. Effect]

Aluminum phosphate has a high melting point of 1800° C. and high thermal stability. When a dense film containing aluminum phosphate as a main component is formed on a surface of a base material such as a thermoelectric material, the film blocks oxygen in the air and prevents volatilization of constituent elements contained in the base material. In addition, the aluminum phosphate film has high thermal stability and does not react with the base material.

Furthermore, optimizing the thickness of the film does not cause pinholes in the film or does not cause peeling or cracks in the film due to thermal stress. Still further, since the film contains aluminum phosphate as the main component, the film does not reduce the electromotive force or the temperature difference of the thermoelectric material even when the base material is a thermoelectric material.

Such a film can be obtained by applying a coating liquid containing aluminum phosphate to a surface of a base material and by drying and firing the coating liquid. The coating is lower in cost than the sputtering and enables easy coating on an uneven surface. Moreover, in a case where the base material is a thermoelectric member, it is possible to coat the entire joint even in the state of the element in which the thermoelectric member and the electrode are joined. Therefore, it is possible not only to protect the surface of the thermoelectric member but also to enhance the reliability of the electrode and the joint at low cost.

A coating liquid containing aluminum phosphate can be applied not only to thermoelectric materials but also to any material in which volatilization or oxidation of constituent elements poses a problem. However, when such a coating liquid is applied to a surface of a certain kind of material, the coating liquid may be repelled from the surface of the material, causing a possibility that a dense antioxidant film cannot be formed.

In contrast, when a proper amount of nonionic surfactant is added to the coating liquid, it is possible to form a dense antioxidant film regardless of the type of material. It is considered that, when a coating liquid is applied to a material having a hydrophobic surface, the addition of a nonionic surfactant to the coating liquid improves the wettability of the coating liquid on the material surface.

Among thermoelectric materials, P-type bismuth telluride is difficult to form a uniform film with a coating liquid. A possible reason is that P-type bismuth telluride has a hydrophobic surface.

In contrast, according to the present invention, a dense aluminum phosphate film can be easily formed on a surface of P-type bismuth telluride. Furthermore, since the formed film enhances the oxidation resistance, the operating temperature of the thermoelectric member including P-type bismuth telluride can be raised to 350° C.

The coating liquid according to the present invention can be applied not only to P-type bismuth telluride but also to any material.

For example, it is known that $R(Fe, Co)_4Sb_{12}$-based thermoelectric materials provide best thermoelectric performance in a temperature range of 550 to 600° C. However, it is known that when this material is used in a high temperature range, Sb is gradually volatilized and thermoelectric properties deteriorate. In contrast, when a dense aluminum phosphate film is formed on a surface of an $R(Fe, Co)_4Sb_{12}$-based thermoelectric material, thermoelectric properties do not deteriorate even when kept at 600° C. for 24 hours in the air, and it is possible to maintain a good interface and good thermoelectric properties.

Even when the base material contains an easily volatilized element or an easily oxidized element other than Te or Sb, it is possible to obtain similar effects to those obtained from a base material containing Te or Sb. This can be attributed to the following reasons.

That is, aluminum phosphate has a high melting point of 1800° C. and is stable. Furthermore, aluminum phosphate efficiently blocks oxygen and easily volatilized elements, and acts as a corrosion-resistant film having an affinity for surfaces of bismuth telluride-based thermoelectric materials and $R(Fe, Co)_4Sb_{12}$-based thermoelectric materials.

Like other phosphates, aluminum phosphate has an affinity for most metals such as Fe, Cu, Mn, and Ti. Accordingly, aluminum phosphate acts as an effective film for a base material containing an easily volatilized element or an easily oxidized element other than Te and Sb.

EXAMPLES

Examples 1 to 4, Comparative Examples 1 to 6

[1. Preparation of Sample]

P-type and N-type bismuth telluride sintered bodies were processed into a cuboid of 1×1×10 mm and the surface of the cuboid was polished. To prepare a coating liquid, various kinds of additives in an amount of 10 vol % were separately added to a commercially available aluminum phosphate coating agent (Master Seal J produced by Audec Co., Ltd.), and each mixture was stirred at 500 rpm for 1 hour.

In regard to the additives,
(a) Polyoxyethylene octyl ether (Triton X) (Example 1),
(b) Ethylene glycol (Example 2),
(c) Triethylene glycol monobutyl ether (Example 3),
(d) 1-methyl-2-pyrrolidone (Example 4),
(e) Acetone (Comparative Example 1),
(f) N, N-dimethylformamide (Comparative Example 2), (g) Diethylamine (Comparative Example 3),
(h) Butyl acetate (Comparative Example 4), and
(i) Toluene (Comparative Example 5),
were used.

Furthermore, an aluminum phosphate coating agent with no additive was used for the test as it was (Comparative Example 6).

[2. Test Method and Results]

Various kinds of coating liquids were painted on surfaces of the P-type and N-type bismuth telluride sintered bodies with a brush, and the wettability of each coating liquid was visually observed under a microscope. Table 1 shows the results.

In Table 1, "o" indicates that a uniform coating liquid was obtained when the coating agent was mixed with the additive and that the wettability was good when the coating liquid was applied to a surface of a sintered body.

"Δ" indicates that a uniform coating liquid was obtained when the coating agent was mixed with the additive and that the wettability was improved when the coating liquid was applied to a surface of a sintered body, but the surface was partially uneven and was not wetted completely.

"x" indicates that the coating agent and the additive were separated into two phases when the coating agent was mixed with the additive or that the coating liquid was repelled from a surface of a sintered body, which made it difficult to coat uniformly.

Table 1 shows the following facts.

(1) When the commercially available aluminum phosphate coating agent with no additive (Comparative Example 6) was applied with a brush directly to the surface of the P-type and N-type bismuth telluride sintered bodies, the coating agent was repelled and could not be applied beautifully.

(2) With the additives in Examples 1 to 4, each coating liquid was not repelled when applied with a brush, indicating that those additives were effective for improving the wettability.

(3) With the additives in Comparative Examples 1 and 2, the wettability was improved as compared with the case using the coating agent with no additive (Comparative Example 6). However, the coating film was uneven, and the wettability was not improved completely.

(4) With the additive in Comparative Example 3, aluminum phosphate was precipitated by mixing the additive. Furthermore, with the additives of Comparative Examples 4 and 5, each coating agent and additive were separated into two layers. Therefore, neither of the coating agents famed a uniform coating film.

TABLE 1

| No. | Additive | Wettability |
|---|---|---|
| Example 1 | Polyoxyethylene octyl ether | o |
| Example 2 | Ethylene glycol | o |
| Example 3 | Triethylene glycol monobutyl ether | o |
| Example 4 | 1-methyl-2-pyrrolidone | o |
| Comparative Example 1 | Acetone | Δ |
| Comparative Example 2 | N,N-dimethylformamide | Δ |
| Comparative Example 3 | Diethylamine | x |
| Comparative Example 4 | Butyl acetate | x |
| Comparative Example 5 | Toluene | x |
| Comparative Example 6 | None | x |

Examples 5 to 7, Comparative Example 7

[1. Preparation of Sample]

An N-type bismuth telluride sintered body and two types of P-type bismuth telluride sintered bodies with different compositions (P-type-1 and P-type-2) were processed into a cuboid of 1×1×10 mm and the surface of the cuboid was polished.

To prepare a coating liquid, polyoxyethylene octyl ether (Triton X) was added to a commercially available aluminum phosphate coating agent (Master Seal J produced by Audec Co., Ltd.), and the mixture was stirred at 500 rpm for 1 hour. The added amount of Triton X was 0 vol % (Comparative Example 7), 1 vol % (Example 5), 5 vol % (Example 6), and 10 vol % (Example 7).

Each coating liquid was applied to the surface of each sintered body. Then, the samples were dried at 90° C. for 1 hour and 120° C. for 1 hour. Furthermore, the samples were fired at 380° C. for 1 hour to form an aluminum phosphate film on the surface of each sintered body.

[2. Test Method and Results]

A durability test was carried out by holding the obtained samples in the air at 380° C. for 24 hours. After the durability test, the oxidation state of each surface was observed with an electron microscope. FIG. 1 shows a cross-sectional photograph of each sample after a durability test (held in the air at 380° C. for 24 hours). Table 2 shows differences in durability between the samples.

In FIG. 1 and Table 2,

"o" represents that the thickness of the reaction layer was 10 μm or less in most regions of a sample surface (80% or more of a surface area of a sample), "Δ" represents that the thickness of the reaction layer was 10 μm or more in a part of a sample surface (20 to 80% of a surface area of a sample), "x" represents that the thickness of the reaction layer was 10 μm or more in most regions of a sample surface (80% or more of a surface area of a sample).

FIG. 1 and Table 2 show the following facts.

(1) In the N-type bismuth telluride, the surface condition was good regardless of the presence or absence of Triton X.

(2) In the P-type bismuth telluride, the surface was oxidized when the coating liquid not containing Triton X was used. On the other hand, with the coating liquid containing Triton X, an antioxidant effect was observed. Particularly, it was found that both P-type-1 and P-type-2 maintained a good surface state when the coating liquid containing 10 vol % of Triton X was used.

TABLE 2

| | No Triton X | With Triton X | | |
|---|---|---|---|---|
| Concentration of Triton X | — | 1% | 5% | 10% |
| N-type | o | o | o | o |
| P-type-1 | x | x | Δ | o |
| P-type-2 | x | Δ | x | o |

Although the embodiments of the present invention have been described in detail, the present invention is not limited to the embodiments and may be modified in various ways without departing from the gist of the present invention.

A coating liquid according to the present invention can be used to form an antioxidant film on a surface of a thermoelectric material.

What is claimed is:

1. A coating liquid comprising:
   aluminum phosphate;
   a nonionic surfactant; and
   water and/or water-soluble solvent that dissolves or disperses the aluminum phosphate and the nonionic surfactant,
   wherein the coating liquid does not contain silica particles, and
   wherein an amount of the nonionic surfactant is 1 vol % or more and 10 vol % or less.

2. The coating liquid according to claim 1, wherein the nonionic surfactant is at least one selected from the group consisting of ester, ether, alkylglycoside, octylphenol ethoxylate, pyrrolidone, and polyhydric alcohol.

3. The coating liquid according to claim 1, wherein the coating liquid is employed for surface coating of an intermetallic compound-based thermoelectric material.

4. The coating liquid according to claim 3, wherein the thermoelectric material is P-type bismuth telluride.

5. A method for manufacturing a thermoelectric member, the method comprising:
   applying the coating liquid according to claim 1 to a surface of a thermoelectric member to form a coating film;
   drying the coating film to obtain a precursor film; and
   firing the thermoelectric member provided with the precursor film.

6. The coating liquid according to claim 1, wherein an amount of the nonionic surfactant is 5 vol % or more and 10 vol % or less.

7. The coating liquid according to claim 1, wherein an amount of the nonionic surfactant is 7.5 vol % or more and 10 vol % or less.

8. The coating liquid according to claim 1, wherein the aluminum phosphate is present in an amount of 20 wt % or more.

* * * * *